United States Patent

Mawatari et al.

[11] Patent Number: 6,139,975
[45] Date of Patent: Oct. 31, 2000

[54] SHEET METAL MEMBER, METHOD OF MANUFACTURING SAME, AND HEAT RADIATION PLATE

[75] Inventors: Osamu Mawatari, Matsudo; Junichi Ichikawa, Kashiwa; Zenzo Ishijima; Hideo Shikata, both of Matsudo, all of Japan

[73] Assignee: Hitachi Powered Metals Co., Ltd., Chiba-Ken, Japan

[21] Appl. No.: 09/230,494

[22] PCT Filed: Jun. 12, 1998

[86] PCT No.: PCT/JP98/02591

§ 371 Date: Jan. 26, 1999

§ 102(e) Date: Jan. 26, 1999

[87] PCT Pub. No.: WO98/56526

PCT Pub. Date: Dec. 17, 1998

[30] Foreign Application Priority Data

Jun. 12, 1997 [JP] Japan ..................................... 9-170968
Jul. 4, 1997 [JP] Japan ..................................... 9-194841

[51] Int. Cl.[7] ................................ B22F 3/24; B22F 5/00; H01L 23/36
[52] U.S. Cl. ........................... 428/600; 428/547; 419/28; 361/709; 264/274
[58] Field of Search ..................................... 428/547, 600, 428/613; 419/28; 361/709; 264/273, 274

[56] References Cited

U.S. PATENT DOCUMENTS

| 5,049,184 | 9/1991 | Harner et al. . |
| 5,481,136 | 1/1996 | Kohmoto et al. . |
| 5,783,316 | 7/1998 | Colella et al. . |
| 6,035,524 | 3/2000 | Suppa et al. . |

FOREIGN PATENT DOCUMENTS

| 7-153878 | 6/1995 | Japan . |
| 9-217102 | 8/1997 | Japan . |

*Primary Examiner*—Deborah Jones
*Assistant Examiner*—Jason Savage
*Attorney, Agent, or Firm*—Scully, Scott Murphy & Presser

[57] ABSTRACT

In a method of manufacturing a sheet member comprising: obtaining a sintered compact by sintering a sheet-like compact having a reduced-thickness portion and an enlarged-thickness portion; and then repressing the sintered compact into a sheet member, a difference in density between the reduced-thickness portion and the enlarged-thickness portion of the sintered compact after repressing is adjusted to be in a range of ±1.5%. By doing so, the accuracy of flatness is enhanced and the amount of distortion, which would otherwise remain in the sheet member, is reduced because the sheet member is formed by sintering the sheet-like compact. In addition, the deformation caused by heating is greatly restricted. Accordingly, the prospect of the sheet member of the present invention is bright as a heat dissipating plate.

19 Claims, 14 Drawing Sheets

(a)

(b)

(a)

(b)

(a)

(b)

(a)

(b)

(a)

(b)

(c)

(a)

(b)

(c)

(d)

SHEET METAL MEMBER, METHOD OF MANUFACTURING SAME, AND HEAT RADIATION PLATE

TECHNICAL FIELD

This invention relates to a sheet member and a method of manufacturing such a sheet member by the powder metallurgical method, specific examples of which sheet member includes a heat dissipating plate such as a heat spreader, a heat sink, or the like, with or without fins. The present invention also relates to such a heat dissipating plate.

BACKGROUND ART

Recently, in the field of semiconductor technologies, integrated circuit boards (IC) have been demanded to become a highly integrated design and a widely versatile design. Along with this tendency, IC packages for placing an IC chip thereon have also been remarkably rapidly enhanced in their performance such as, for example, small design, increased capacity, thin design, increased number of pins, and the like. As the performance has been enhanced, their heating value also tended to be consistently increased. For example, IC packages having a heating value of several W have been increasingly provided with a heat dissipating plate called "heat spreader". IC packages having such a large heating value as exceeding 10 W have been increasingly provided with a heat dissipating plate called "heat sink".

For example, the heat spreader is typically a regular square sheet having a side length dimension of about 25 to 45 mm and a thickness of about 0.5 to 1.0 mm and has a recess formed in the center of its single surface which recess is intended for an IC to be placed therein. Such a heat spreader is mounted on a substrate with an IC placed thereon and molded with resin so as to form an IC package. In that state of the IC package, the surface of the heat spreader is exposed outside to dissipate heat. Some heat spreaders are formed on their upper surface or lower surface with fins which are adapted to enhance the effect of heat dissipation or heat absorption. Fins are sometimes formed on a lower surface of each heat spreader which lower surface is embedded in resin. A plurality of holes for filling the resin therein are also occasionally formed in the lower surface of the heat spreader, so that the heat spreader will not peel off the resin. Conventionally, such heat spreaders are produced by plastic working, for example, punching, drawing, rolling a metal sheet with high thermal conductivity, such as copper, aluminum, or the like. The aforementioned heat sink is, in use, placed on the IC package on which the heat spreader is placed, in order to further enhance the heat dissipation of the heat spreader. Such heat sinks are also produced likewise by plastic working, for example, bending, extruding, punching a metal sheet with high thermal conductivity, such as aluminum, or the like. In particular, in the case that the fins are comparatively large in height, they are conventionally formed by engraving through machining.

As previously discussed, IC packages have been tended to be consistently increased in heating value. Along with this tendency, more enhanced effect of heat dissipation for heat spreaders and heat sinks has naturally been increasingly demanded. One approach was made for this purpose to increase the number and length dimension of the fins. However, it is difficult to increase the number and length dimension of the fins by the plastic working technique. If machining is employed in order to obviate this shortcoming, another shortcoming is encountered in that the cost is increased. Additionally, there is still another shortcoming in that the holes formed in the heat spreader for the purpose of preventing the heat spreader from peeling off resin is not good enough when a large force is applied or in other similar cases.

With plastic working, distortion created during plastic working occasionally inevitably remains in final products in the form of residual stress. If such residual stress is left as it is, the heat spreader would be warped or flexed because the residual stress is released by heat when a circuit is formed on a substrate on which the heat spreader is placed, by bonding, or the like. Such deformation has the risk to degrade the accuracy of flatness of the surface of the substrate on which the heat spreader is to be mounted on the substrate, thereby not only degrading the intimacy between the heat spreader and the substrate but also resulting in many other disadvantageous effects for the IC package as a whole, such as, breakage of a connecting wire, peeling-off of an IC chip, poor formation of solder balls, and the like. In order to avoid such inconveniences and disadvantages, a proposal was made, in which a sheet having a through hole formed by punching is attached to a central region of a heat spreader by an adhesive agent. However, since there is a need of two members for this proposed method, additional problems are newly created in that the number of processes is increased, the sheet tends to peel off the heat spreader during heating due to difference in thermal expansion between the adhesive agent and the sheet, or the rigidity becomes insufficient due to the fact that the sheet is attached to the heat spreader by bonding.

It is an object of the present invention to provide a method of manufacturing a sheet member in which amount of distortion is restricted and the accuracy of flatness is maintained at a high level, and which is especially suited to be used for manufacturing a heat dissipating plate such as a heat spreader, a heat sink, or the like, with or without fins which heat dissipating plate is resin molded, for example, to an IC package; and to provide a heat dissipating plate.

DISCLOSURE OF THE INVENTION

A method of manufacturing a sheet member according to the present invention comprises: obtaining a sintered compact by sintering a sheet-like compact having a reduced-thickness portion and an enlarged-thickness portion; and then repressing the sintered compact into a sheet member, wherein a difference in density between the reduced-thickness portion and the enlarged-thickness portion of the sintered compact after the repressing is in a range of ±1.5%.

The study of the inventors of the present invention reveals that in order to use a sheet-like sintered compact as a heat spreader, its flatness is essentially required to be less than 0.05 mm before it is mounted on a semiconductor. As a result of repeated study for obtaining such a sheet-like sintered compact, they found out the fact that there exists a correlation, as set forth hereinafter, between the flatness and the difference in density between the reduced-thickness portion and the enlarged-thickness portion after sintering and then repressing. That is, a difference in density between the reduced-thickness portion and the enlarged-thickness portion reflects differences in the green density and in pressure (working degree) applicable at the time of repressing. The smaller the difference is, the more enhanced the flatness is after repressing. According to the experiments carried out by the inventors of the present invention, it is necessary to make the difference in density between the reduced-thickness portion and the enlarged-thickness portion, after sintering and then repressing, into a range of ±1.5% by adjusting the pressure distribution at the stage of forming a compact or at the time of repressing, in order to make the flatness, after repressing, to less than 0.05. The present invention has been accomplished based on this finding.

A true density ratio after repressing also reflects the pressure applicated at the time of repressing. It is necessary to set the green density to 87% or more in order to make a handling of the compact but 93% or less in order to prevent an occurrence of galling to a die. In repressing a sintered compact obtained by sintering a compact having such a density ratio, in the case that the true density ratio after repressing is small, the flatness is degraded due to insufficient dimension correction. In contrast, in case the true density ratio after repressing is large, the flatness is degraded due to large spring back. The experiments carried out by the present inventor reveal that in order to make the flatness after repressing to less than 0.05, it is necessary to limit the true density ratio after sintering and repressing in a range of 95 to 99% by adjusting the pressure applicable at the stage for forming the compact or at the time of repressing. Therefore, it is essential for the present invention to limit the true density ratio of the sintered compact after repressing in a range of 95 to 99%.

With a sheet member obtained while satisfying the above two conditions, the accuracy of flatness is extensively enhanced and the amount of distortion remained in the sheet member is reduced also attributable to the fact that it is formed by sintering. As a consequence, the deformation caused by the effect of heat is greatly reduced. Thus, the sheet member of the present invention can be used as a heat dissipating plate with full satisfaction.

It should be noted that, in the present invention, ribs are formed on at least one surface of the compact and those ribs are allowed to remain even after the repressing operation, rigidity is enhanced and deformation can be prevented, even if distortion remains after repressing.

In the case that the sheet member is formed in a generally rectangular configuration, the side portions of the sintered compact sometimes tend to expand outwardly, thereby degrade the accuracy of configuration. To avoid this, in the above-mentioned method, an inwardly curved recess is formed in each side portion of the compact when the compact is formed. By doing so, the recess is swollen after repressing and each side portion is straightened linearly to enhance the configuration accuracy. At the same time, the residual stress is diminished. Although when the heat spreader is built in a semiconductor and molded with resin, gas is generated from the periphery of the semiconductor by heat of the resin, degassing holes can be formed simply by forming through holes extending widthwise and without a need of mechanical machining. In case such holes are difficult to form, the difficulty can easily be overcome by preliminarily forming dents in those area where the holes are to be formed.

Also, the sheet member according to the present invention is characterized by having a reduced-thickness portion and an enlarged-thickness portion obtained by repressing the sintered compact and a difference in density between the reduced-thickness portion and the enlarged-thickness portion of the sintered compact after the repressing being in a range of ±1.5% . It also includes the one in which a true density ratio of the sintered compact after the repressing is in a range of from 95 to 99%. In such a sheet member, since amount of distortion due to temperature increase is reduced because of the reasons mentioned previously, no problems will occur even if it goes through a process of manufacturing a semiconductor chip where heat generation occurs. Therefore, the sheet member according to the present invention is most suitable to be used as a heat dissipating plate.

Another method of manufacturing a sheet member according to the present invention relates particularly to a method of shaping fins. It comprises: producing a compact having a sheet-like main portion and an embossed portion protruding from the main portion; obtaining a sintered compact by sintering said compact; and then repressing the same; and compressing the embossed portion while the repressing is undergoing, thereby forming a fin.

In this invention, since the fin is formed when the embossed portion is compressed and plastically flowed, a similar density, namely, thermal conductivity, as the main portion can be obtained. As a result, there can be obtained a sheet member having a high heat dissipating effect as a whole. Since the embossed portion is preliminarily compressed, amount of plastic flow is reduced. Therefore, the fin can easily be shaped.

For forming a fin according to the above manufacturing method, when the embossed portion, which is to be formed into a fin, is formed in the form of a platform, plastic flow readily occurs and therefore, the fin can easily be formed. Also, by forming the embossed portion in the form of a platform, the embossed portion is less damaged and less crumbled when the compact is removed from the shaping die. As a consequence, workability is enhanced.

When the embossed portion is in the form of a ridge or a protrusion having a larger dimension than a desired dimension of the fin generally in proportion to the shape of the fin after manufacturing, workability of the fin after manufacturing is enhanced because the thickness of the ridge and the largeness of the protrusion decrease. This is preferable in view of obtaining a desired density. As means for enhancing the workability, it is accepted that the embossed portion is formed on an opposite side to the area where the fin is formed after manufacturing. In this case, the embossed portion is pushed up towards the fin shaping portion side and therefore, workability is enhanced.

When a plurality of embossed portions are arranged in array from one end of the sintered compact to the other end, such that the embossed portions are gradually increased in height towards the center in a direction of the array, the working degree at the central portion, which would otherwise tend to become coarse, is increased, whereby a sufficient green density at the central portion can be obtained. To achieve this purpose, it is also accepted that a plurality of embossed portions having the same height are arranged in array, and are repressed such that the embossed portions are gradually reduced in height towards the center in a direction of the array.

In the above manufacturing method, a plurality of tiny bumps and valleys can be formed on a working surface of at least one of repressing punches for forming surfaces of the sheet member by means of electric discharge working, shot blast or the like. By doing so, the bumps and valleys are transferred to the main portion or the fin when repressing. As a result, the surface area of the sheet member is increased. Thus, desirable heat dissipation (heat absorption) is enhanced.

In a method of manufacturing a sheet member molded with resign such that only one surface of the sheet member is exposed, the method comprises: obtaining a sintered compact by sintering a compact; then repressing the sintered compact; and forming an engaging wall portion on the sheet member while the repressing is undergoing so that the sheet member will not escape from the resin.

According to the sheet member obtained by this invention, even if a force is applied to the sheet member molded with resin in a direction peeling off the resin, escape of the sheet member from the resin is prevented by the engaging wall portion. Since the engaging wall portion is formed during the repressing operation after the sintering process, it can easily be formed without a need of cutting treatment, or the like. Specifically, it is preferred that the engaging wall portion is gradually increased in sectional area in an opposite direction to an escaping direction of the sheet member from the resin.

BRIEF DESCRIPTION OF THE DRAWINGS

FIG. 4(a) is a sectional view showing a setting state, FIG. 4(b) is a sectional view showing an initial state of pressing, and FIG. 4(c) is a sectional view showing a last state of pressing.

FIG. 9(a) is a sectional view of a starting material, and FIG. 9(b) is a sectional view of a sheet member manufactured.

FIG. 10(a) is a sectional view of a starting material, and FIG. 10(b) is a sectional view of a sheet member manufactured.

FIG. 11(a) is a sectional view of a starting material, and FIG. 11(b) is a sectional view of a sheet member manufactured.

FIG. 12(a) is a sectional view of a starting material, and FIG. 12(b) is a sectional view of a sheet member manufactured.

FIG. 13(a) is a sectional view of a starting material, and FIG. 13(b) is a sectional view of a sheet member manufactured.

FIG. 14(a) is a sectional view of a starting material, FIG. 14(b) is a sectional view of a heat spreader manufactured, and FIG. 14(c) is a sectional view showing a state that the heat spreader is molded with resin.

FIG. 15(a) is a sectional view of a starting material, FIG. 15(b) is a sectional view of a heat spreader manufactured, and FIG. 15(c) is a sectional view showing a state that the heat spreader is molded with resin.

FIG. 16(a) is a sectional view of the heat spreader, and FIG. 16(b) is a sectional view showing the heat spreader molded with resin.

FIG. 17(a) is a sectional view of the heat spreader, and FIG. 17(b) is a sectional view showing a state that the heat spreader is molded with resin.

FIG. 18(a) is a sectional view of a heat spreader, FIG. 18(b) is a sectional view of a repressing process of the heat spreader, and FIG. 15(c) is a sectional view showing a state that the heat spreader is molded with resin.

FIG. 19(a) is a sectional view of a heat spreader, FIG. 19(b) is a sectional view of a starting material, FIG. 19(c) is a sectional view showing a state that an engaging wall portion is formed by repressing the starting material, and FIG. 19(d) is a sectional view showing a state that the heat spreader is molded with resin.

FIG. 20(a) is a sectional view of a sintered compact, FIG. 20(b) is a sectional view of a state that the sintered compact is set to a repressing die, FIG. 20(c) is a sectional view showing a state that an engaging wall portion is formed by repressing the sintered compact, and FIG. 19(d) is a sectional view of the heat spreader, and FIG. 20(e) is a sectional view showing a state that the heat spreader is molded with resin.

FIG. 21(a) is a sectional view of a heat spreader, FIG. 21(b) is a perspective view of a part of the heat spreader, and FIG. 21(c) is a sectional view showing a state that the heat spreader is molded with resin.

BEST MODE FOR CARRYING OUT THE INVENTION

Preferred embodiments of the present invention will be described hereinafter with reference to the drawings.

First Embodiment

Figure 1:
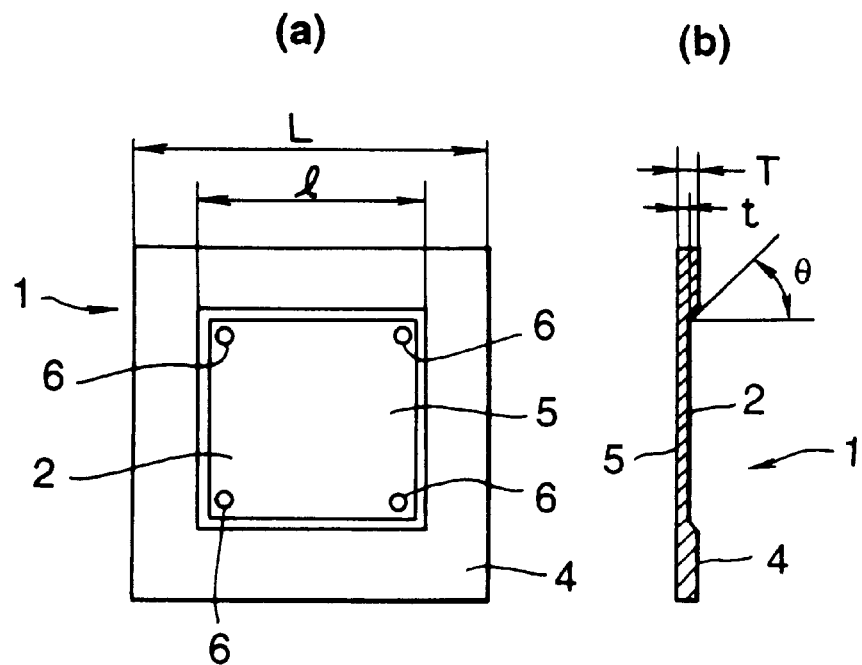
FIGS. 1(a) is a plan view of a heat spreader manufactured by a manufacturing method according to the first embodiment of the present invention and FIG. 1(b) is a sectional view thereof.

The first embodiment, in which the present invention is applied to a method of manufacturing a heat spreader, will be described hereinafter with reference to the drawings. In FIGS. 1(a) and 1(b), reference numeral 1 denotes a heat spreader manufactured by a manufacturing method according to the first embodiment. This heat spreader 1 is a sheet-like sintered compact having a regular square configuration. The dimensions of the heat spreader 1 are: one side L: 20 to 45 mm and thickness T: 0.3 to 1.0 mm. The heat spreader 1 has a regular square recess 2 formed in the central area of one surface thereof. This recess 2 is adapted to receive an IC therein. The dimensions of the recess 2 are: one side 1: 10 to 25 mm and thickness t: 0.2 to 0.6 mm. That part of area of the heat spreader 1 where the recess 2 is formed is a reduced-thickness portion 5. The heat spreader 1 has an enlarged-thickness portion 4 around the recess 2. A transient portion from the enlarged-thickness portion 4 to the reduced-thickness portion 5 is a slant surface having an angle θ of about 30 degrees. The four angles of the recess 2 each have a degassing hole 6 having diameter of about 0.8 mm. Those degassing holes 6 are adapted to dissipate gas generated by heat of resin during a molding operation of a semiconductor housing the heat spreader 1 with resin. First, the first process for manufacturing a compact serving as a starting material for manufacturing the heat spreader 1 will be described.

(1) First Process: Forming of Compact

Figure 2:
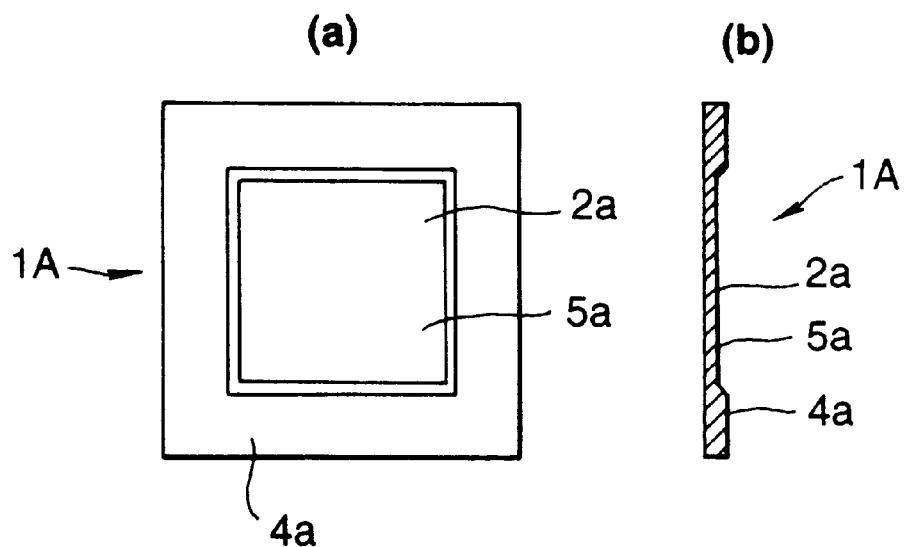
FIG. 2(a) is a plan view of a compact manufactured in the first process according to the first embodiment of the present invention and FIG. 2(b) is a sectional view thereof.
Figure 3:
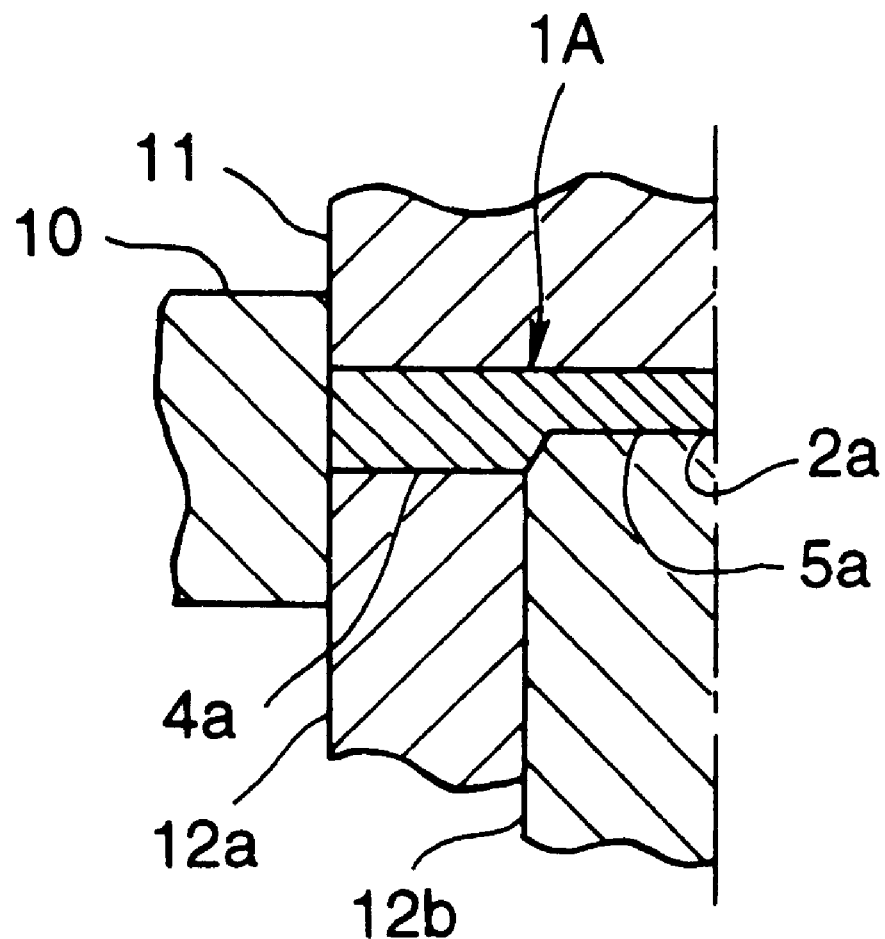
FIG. 3 is a sectional view showing a state that a compact is formed in the first process according to the first embodiment of the present invention.

A compact 1A of FIGS. 2(a) and 2(b) is formed using alloy powder of Al—Mg—Si or powder of Cu as a starting powder. This compact 1A is generally in proportion, in configuration and dimension, to the heat spreader 1. In a central area of one surface of the compact 1A, a recess 2a corresponding to the recess 2 is formed. The compact 1A also includes an enlarged-thickness portion 4a and a reduced-thickness portion 5a. In order to form such a compact 1A, as shown in FIG. 3, the starting material filled in a die 10 is compressed by an upper punch 11, an outer lower punch 12a and an inner lower punch 12b. The outer and inner lower punches 12a, 12b of the die assembly are adapted to shape the enlarged-thickness portion 4a and the reduced-thickness portion 5a, respectively. That is, the enlarged-thickness portion 4a is shaped by the outer lower punch 12a and the reduced-diameter portion 5a is shaped by the inner lower punch 12b. Therefore, the green density and the difference in step dimension between the enlarged-thickness portion 4a and the reduced-thickness portion 5a are adjusted by projecting amounts of the outer and inner lower punches 12a, 12b. Suitable pressing conditions are, for example, about 10 to 70 Mpa.

The green density of the compact 1A is preferably 87 to 93%. As previously mentioned, if the green density is less than 87%, the compact 1A tends to crumble when it is handled: for example, when the compact 1A is taken out, when it is moved and the like. In contrast, if the green density is more than 93%, galling tends to occur to the die due to overload when the material powder is compressed.

(2) Second Process: Sintering Compact

Figure 4:
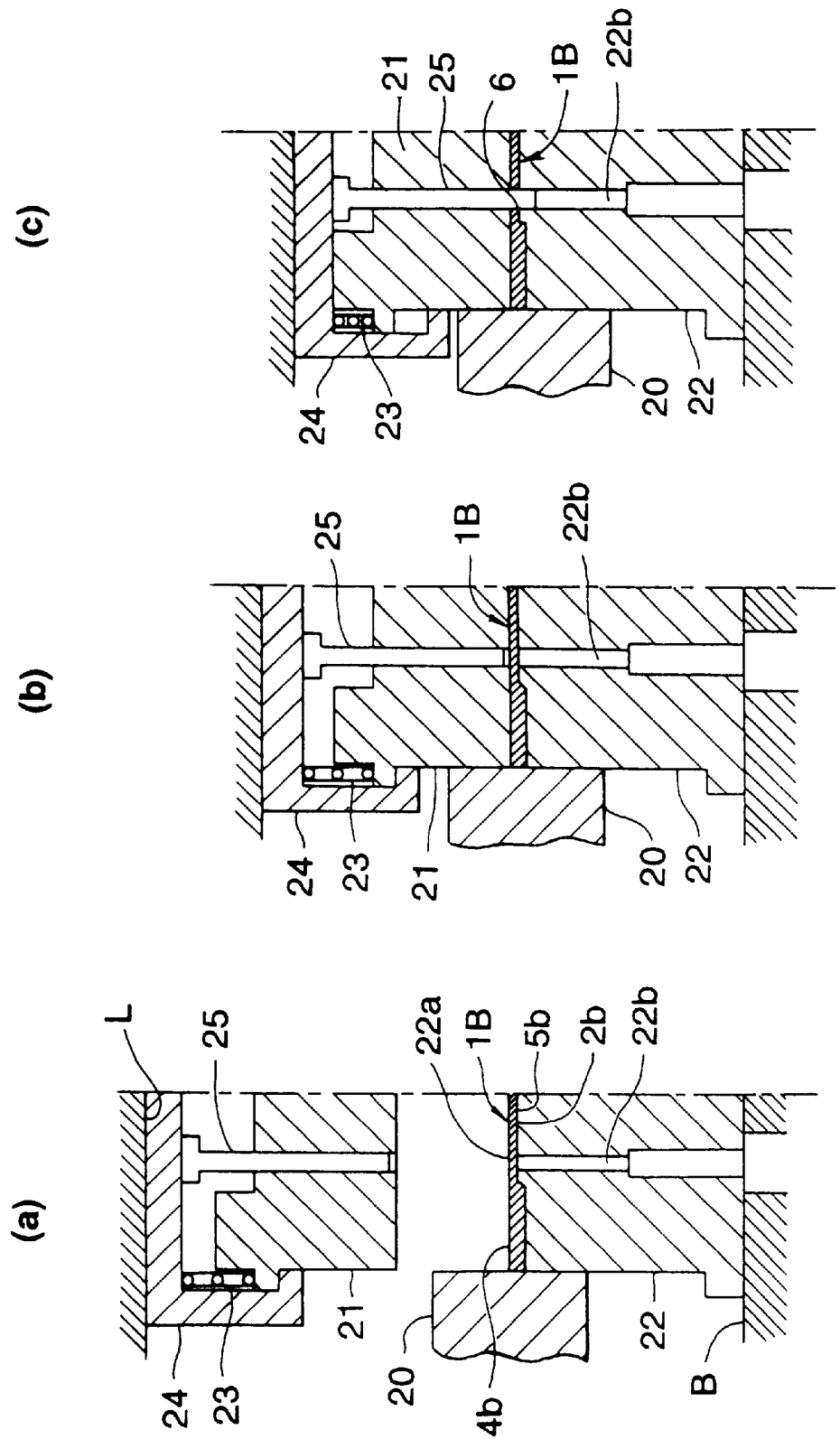
FIGS. 4(a) to 4(c) show a sequence of repressing a sintered compact in the third process of the first embodiment of the present invention.

The compact 1A thus formed by the die assembly is sintered under prescribed conditions by a sintering furnace (not shown), to obtain a sintered compact which is denoted by reference numeral 1B of FIG. 4. The sintered compact 1B has a configuration and a dimension generally in proportion to the heat spreader 1. At a central area of one surface of the sintered compact 1B, a recess 2b corresponding to the recess 2, an enlarged-thickness portion 4b and a reduced-thickness portion 5b remain. Sintering temperatures are preferably about 500 to 600° C. in a non-oxidizing atmosphere in the case that the starting material is, for example, Al—Mg—Si alloy powder and about 800 to 1000° C. in a reducing atmosphere in the case that the starting material is, for example, Cu powder.

(3) Third Process: Repressing Sintered Compact

The sintered compact 1B obtained in the second process is repressed to shape into a final product, i.e., subjected to sizing operation. For this purpose, a repressing die of FIG. 4 are employed. This repressing die comprises a vertically movable die 20 and an upper and a lower punch 21, 22 disposed above and under the die 20. The upper punch 21 is vertically slidably supported via a spring 23 by a guide 24 which is fixed to a ram L of a press, such that it can move upwardly and downwardly together with the ram L as a whole. A lower surface as a pressing surface of the upper punch 21 is flattened. A boring punch 25 for forming the degassing hole 6 is vertically slidably inserted into the upper punch 21. An upper end portion of the boring punch 25 is in abutment with the ram L. The lower punch 22 is fixed to a bed B of the press. An upper surface as a pressing surface of the lower punch 22 is formed with a slightly projecting protrusion 22a corresponding to the recess 2 of the heat spreader 1. The lower punch 22 is also formed with a boring die 22b into which the boring punch 25 is inserted.

For repressing the sintered compact 1B, first, as shown in FIG. 4(a), the compact 1A is set into a cavity defined by the die 20 and the lower punch 22, with the recess 2b in conformity with the protrusion 22a. Then, the ram L goes down, and the upper punch 21 goes down together with the guide 24 to compress the sintered compact 1B as shown in FIG. 4(b). Then, the ram L further goes down to pierce the boring punch 25 into the sintered compact 1B to form the degassing hole 6 and to press an upper end face of the upper punch 21 for repressing (FIG. 4(c)). The pressure for this repressing is preferably about 30 to 50 Mpa in the case that the material powder is alloy powder of Al—Mg—Si and preferably about 30 to 70 Mpa in the case that the material powder is Cu powder. Then, the ram L moves upwardly and the die 20 moves downwardly, so that the sintered compact 1B placed on the upper surface of the lower punch 22 is removed as a final product, namely, the heat spreader 1 of FIG. 1.

Figure 5:
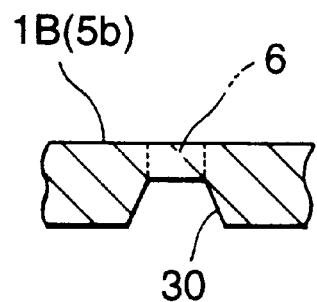
FIG. 5 is a sectional view showing a method of forming a degassing hole in a sintered compact.
Figure 6:
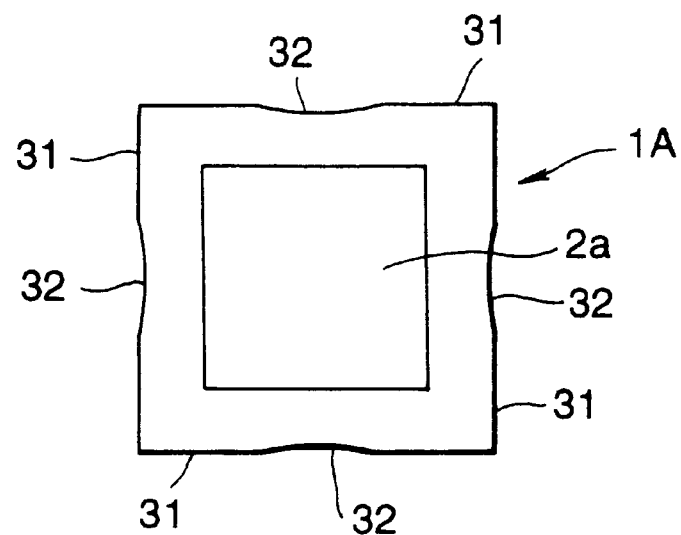
FIG. 6 is a plan view showing another form of a compact.

In the case that the reduced-thickness portion 5b has a thickness difficult to bore the degassing hole 6 in the repressing process, as shown in FIG. 5, when the compact 1A is formed, a recess 30 is preliminarily formed in that area of the reduced-thickness portion 5b where the degassing hole 6 is to be bored, so that the boring punch 25 can easily be pierced. After repressing, the configuration accuracy is degraded in some cases because each side portion 31 of the sintered compact 1B tends to expand outwardly. To avoid this, as shown in FIG. 6, an inwardly curved recess 32 is preliminarily formed in a central portion of each side portion 31 when the compact 1A is formed. When such a sintered compact 1B is repressed, the recess 32 is swollen and each side portion 31 is straightened linearly to enhance the configuration accuracy. At the same time, the residual stress is diminished.

Here in this embodiment, the difference in density between the enlarged-thickness portion 4 and the reduced-thickness portion 5 of the heat spreader 1 obtained by repressing is in a range of ±1.5% and the true density ratio of the entire heat spreader 1 is in a range of 95 to 99%. By satisfying those conditions, flatness of the heat spreader 1 is obtained. The expression "true density ratio" used herein refers to "at what ratio the pores remain in the heat spreader 1 after repressed". The smaller the ratio of the remained pores is, the higher the true density ratio is. Therefore, in order to satisfy those conditions after repressing, it becomes necessary to preliminarily adjust the density ratio between the enlarged-thickness portion 4a and the reduced-thickness portion 5a based on the vertical positions of the outer and inner lower punches 12a, 12b, and to preliminary adjust the compressing height of the compact 1A based on the position of the lower dead point of the upper punch 11, when the compact 1A is formed in the first process.

Figure 7:
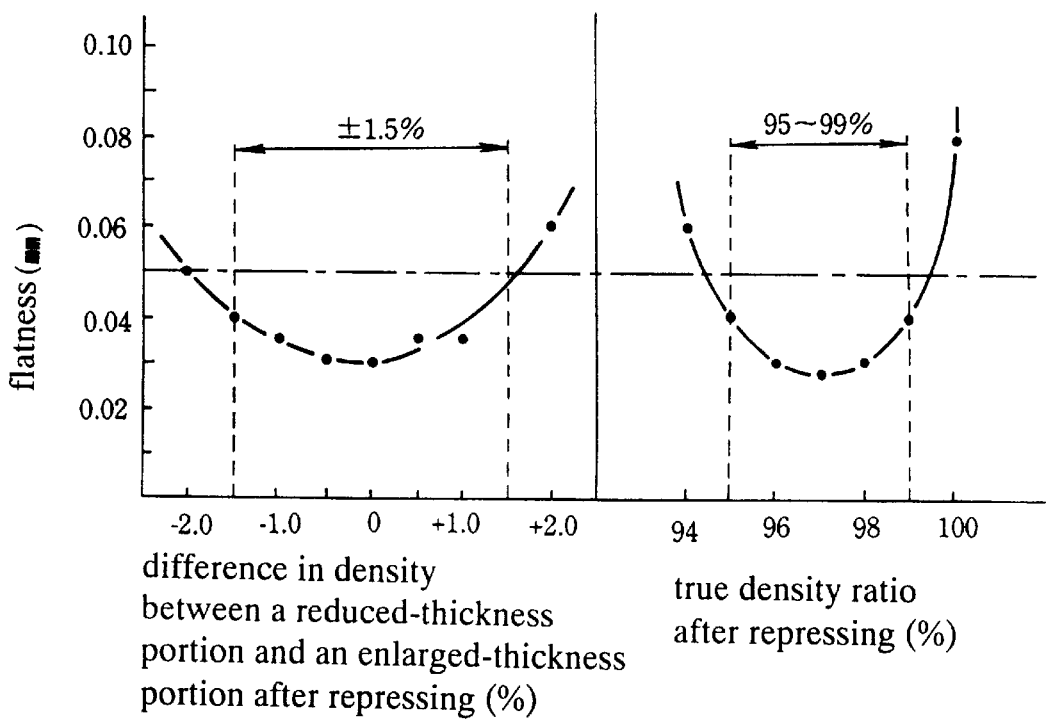
FIG. 7 is a graph showing a relation between a difference in density and a true density ratio of the reduced-thickness portion of a sintered compact after repressing with respect to the enlarged-thickness portion, and flatness.

In order to prove that the flatness can assuredly be obtained under the above conditions, plural kinds of samples in which density of the enlarged-thickness portion 4a is different from that of the reduced-thickness portion 4b in the compact 1A were produced by adjusting the projecting amount of the inner lower punch 12b and the position of the lower dead point of the upper punch 11 of FIG. 3. A relation between the difference in density of the reduced-thickness portion 5a against the enlarged-thickness portion 4a and the flatness after repressing and a relation between the true density ratio of the entire heat spreader 1 and the flatness after repressing are shown in Table 1 and Table 2, respectively. Also, therelation is shown in FIG. 7.

TABLE 1

Difference in density of reduced-thickness portion against enlarged-thickness portion and flatness after repressing

| density difference (%) | −2.0 | −1.5 | −1.0 | −0.5 | 0 |
|---|---|---|---|---|---|
| flatness (mm) | 0.050 | 0.040 | 0.036 | 0.030 | 0.030 |
| density difference (%) | +0.5 | +1.0 | +1.5 | +2.0 | — |
| flatness (mm) | 0.037 | 0.036 | 0.040 | 0.061 | — |

TABLE 2

True density ratio and flatness after repressing

| true density ratio (%) | 94 | 95 | 96 | 97 | 98 | 99 | 100 |
|---|---|---|---|---|---|---|---|
| flatness (mm) | 0.061 | 0.040 | 0.030 | 0.028 | 0.030 | 0.040 | 0.080 |

As shown in FIG. 7, in order to obtain a value smaller than 0.05 mm as highly accurate flatness, it is necessary that the difference in density of the reduced-thickness portion 5 against the enlarged-thickness portion 4 after repressing is in a range of ±1.5% and the true density ratio of the entire heat spreader 1 is in a range of 95 to 99%. That is, by limiting the difference in density of the reduced-thickness portion 5 against the enlarged-thickness portion 4 after repressing in a range of ±1.5% and the true density ratio of the entire heat spreader 1 in a range of 95 to 99%, a high accuracy of flatness can be obtained where the flatness is smaller than 0.5 mm.

Since the heat spreader is manufactured by sintering in addition to the feature that a high accuracy of flatness is obtained, the stress remained inside is reduced when compared with the conventional manufacturing method employing a plastic processing. Accordingly, even if heat should be generated when a circuit is formed by bonding or the like on a substrate mounted with the heat spreader 1 in order to make an IC package or when the heat spreader 1 is actuated as a semiconductor, the heat spreader 1 would be hardly deformed by released remaining stress. Therefore, since the high accuracy of flatness is maintained and intimacy of the heat spreader 1 with respect to the substrate is maintained for a long period of time, the performance of the semiconductor is maintained at a high level when it is mounted as a semiconductor.

In FIGS. 8(a) to 8(h), a rib 3 is formed on the other surface of the heat spreader 1 which is flat and no recess 2 is formed. By preliminarily forming such a rib 3 during the forming operation of a compact and remaining it even after the repressing, rigidity is enhanced. In addition, any deform, even if it is remained after the repressing operation, the deformation is diminished.

Figure 8:
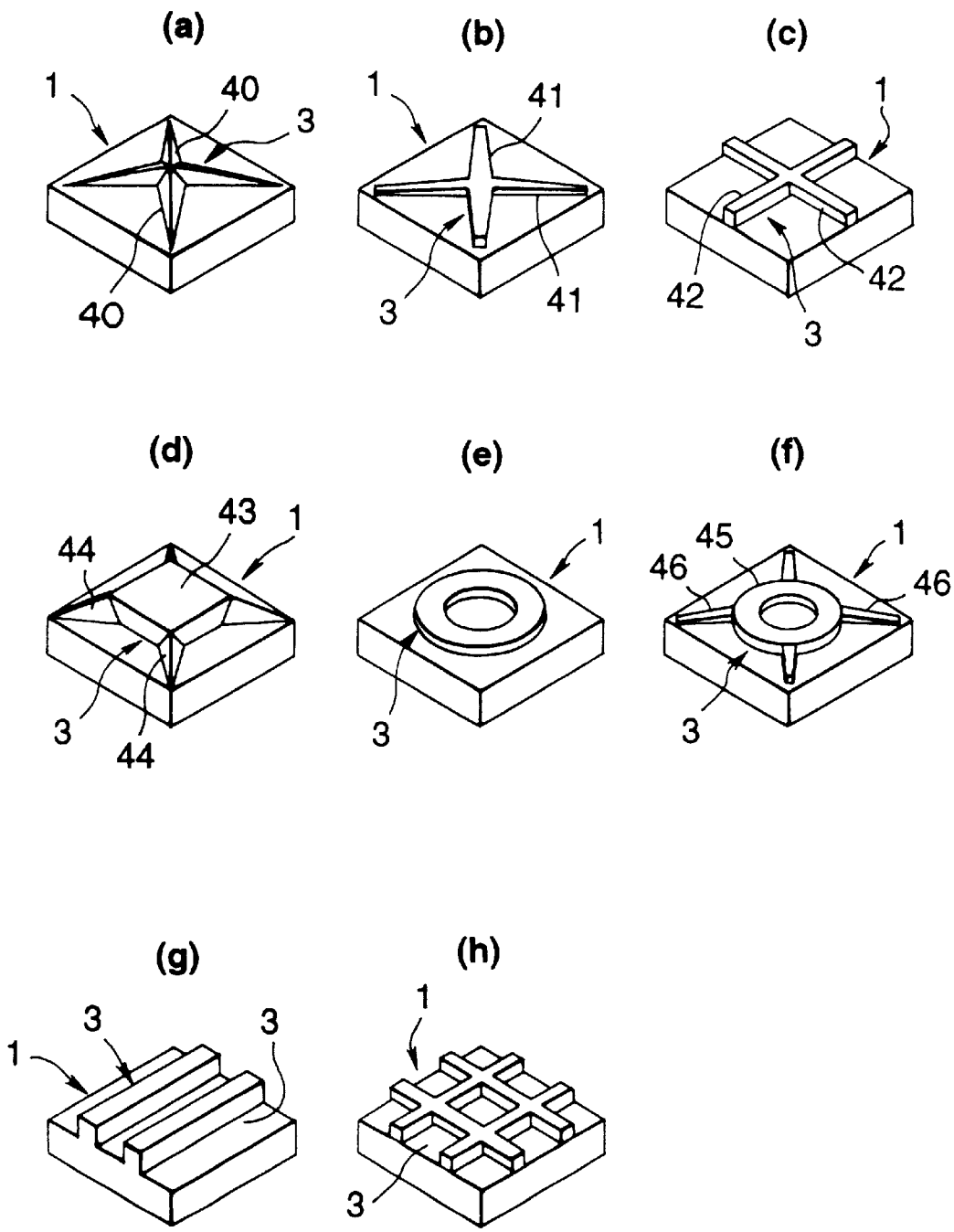
FIGS. 8(a) to 8(h) are perspective views showing various forms of ribs which are to be formed on the heat spreader.

Varieties of configurations of the rib 3 will be described in detail. FIG. 8(a) shows a cross-like star configuration formed by downwardly slanted radiating portions 4 each having a triangular shape in section and extending from a central hill top portion towards each corner of the heat spreader 1, FIG. 8(b) is a modification of FIG. 8(a) in which the radiating portions of the cross-like star configuration are generally constant in height, and FIG. 8(c) is a modification of FIG. 8(b) in which each radiating portion 42 is perpendicular to the corresponding each side of the heat spreader 1. FIG. 8(d) shows a configuration formed by downwardly slanted short radiating portions 44 each having a triangular shape in section and extending from a central rectangular hill top 43 towards each corresponding corner of the heat spreader 1. FIG. 8(e) shows a circular configuration formed around the center of the heat spreader 1, and FIG. 8(f) is a modification of FIG. 8(e) in which downwardly slanted radiating portions 46 extend from a circular rib portion 45 towards the corresponding corners of the heat spreader 1. FIG. 8(g) shows a configuration formed by two ribs extending in parallel relation to each other from one of a pair of opposite sides of the heat spreader 1 to the other, with a central area of the upper surface of the heat spreader 1 disposed therebetween, and FIG. 8(h) shows a configuration formed by ribs arranged crosswise in two parallels.

In the first embodiment, the lower punch for powder compressing comprises the outer and inner lower punches 12a, 12b. However, for mass production, a lower punch comprising an integrally combined outer and inner lower punches is employed. Also, by providing a difference in repressing pressure between the reduced-thickness portion and the enlarged-thickness portion, the density ratio can be established.

Second Embodiment

The second embodiment of the present invention will now be described.

The second embodiment relates to a method of manufacturing a sheet member having a fin on an upper surface of a sheet-like main portion and having a regular square configuration in plan view, by sintering. Embodiments 1 to 7 based on the first embodiment will be described hereinafter.

Figure 9:
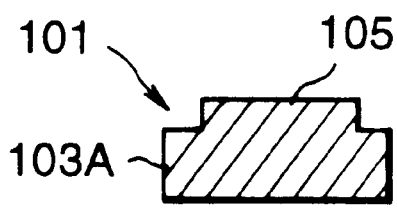
FIGS. 9(a) and 9(b) are views showing manufacturing processes of a sheet member of Embodiment 1 according to the second embodiment of the present invention.
Figure 9:
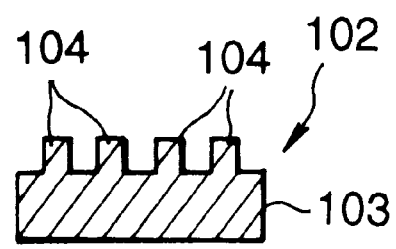

(1) Embodiment 1—FIG. 9

FIG. 9(a) shows a sintered compact 101 obtained by sintering a compact. The sintered compact 101 includes a sheet-like main portion 103A and a platform-like embossed portion 105. This embossed portion 105 has an appropriate generally constant thickness and it is formed on a central area of an upper surface of the sheet-like main portion 103A. The thickness of the embossed portion 105 is appropriately established based on the pressure applicable at the time of a repressing operation on a subsequent stage, the green density of the sintered compact 101, etc. Then, the sintered compact 101 is repressed by a repressing die. A coining form corresponding to a desired configuration of the fin is formed on a working surface of an upper punch of the repressing die. FIG. 9(b) shows a sheet member 102 having fins, obtained by repressing. This sheet member 102 has a plurality of fins 104 formed thereon by the coining form, in parallel relation in a direction perpendicular to the sheet surface of the drawing. Those fins 104 are formed by plastic flow of the embossed portion 105 of the sintered compact 101 which plastic flow occurs when the embossed portion 105 is compressed at the time of repressing.

According to the Embodiment 1, the fins 104 of the sheet member 102 thus obtained are formed when the sintered compact 101 is plastic flowed during the repressing operation. Since the embossed portion 105 is in the form of a platform, plastic flow readily occurs. Therefore, the fins 104 can easily be formed. Also, since it is only needed to form the embossed portion 105 for forming the material as a compact, the die is simplified in structure and in addition, the compact is easy to handle, thus enhancing workability.

Figure 10:
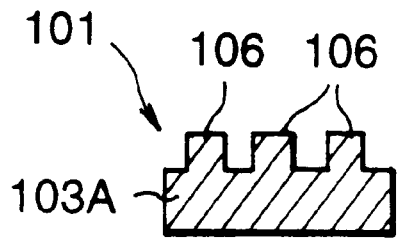
FIGS. 10(a) and 10(b) are views showing manufacturing processes of a sheet member of Embodiment 2 according to the second embodiment of the present invention.
Figure 10:
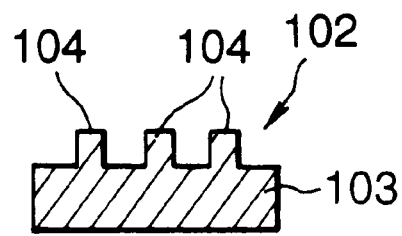

(2) Embodiment 2—FIG. 10

Embodiment 2 based on the first embodiment of the present invention will now be described.

FIG. 10(a) shows a sintered compact 101 obtained by sintering a compact. The sintered compact 101 includes a sheet-like main portion 103A and a plurality of ridges (embossed portions) 106 formed on an upper surface of the main portion 103A in parallel relation in a direction perpendicular to the sheet surface of the drawing. The number, thickness and height of the ridges 106 are generally in proportion to those of the fins of a sheet member to be manufactured. They are larger than the desired dimensions of the fins and appropriately established based on pressure applicable at the time of repressing, density of the sintered compact 101, etc. Then, the sintered compact 101 is repressed by a repressing die. A coining form corresponding to a desired configuration of the fins is formed on a punching surface of an upper punch of the repressing die. FIG. 10(b) shows a sheet member 102 having fins, obtained by repressing. This sheet member 102 has a plurality of fins 104 formed on an upper surface of a main portion 103 by the coining form. Those fins 104 are formed when the ridges 106 of the sintered compact 101 are reduced in thickness by being compressed and plastic flowed at the time of repressing.

Since the fins 104 of the sheet member 102 thus obtained according to Embodiment 2 are formed when the ridges 106 of the sintered compact 101 are plastic flowed during the repressing operation, the working degree of the fins 104 becomes particularly high at the time of repressing and an equal density of the fins 104 to that of the main portion 103 is ensured. For this reason, the heat dissipating effect of the sheet member 10 having fins as a whole is extensively enhanced. Since the ridges 106 of the sintered compact 101 are larger in dimension than the fins 104, they are less damaged and less collapsed when compared with a case where the ridges are the same in dimension as the fins 104. As a consequence, the compact is easy to handle and workability is enhanced.

Figure 11:
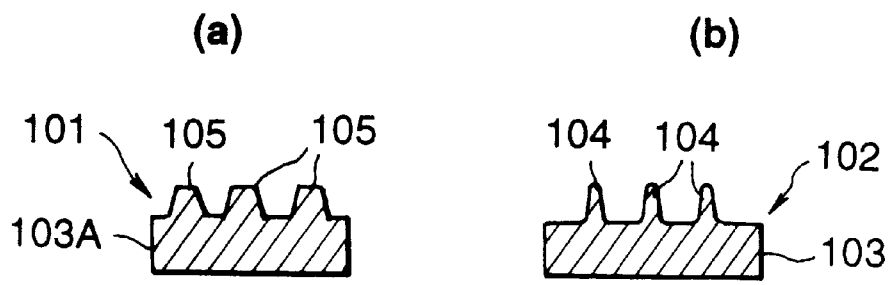
FIGS. 11(a) and 11(b) are views showing manufacturing processes of a sheet member of Embodiment 3 according to the third embodiment of the present invention.

(3) Embodiment 3—FIG. 11

Embodiment 3 based on the first embodiment of the present invention will now be described.

FIG. 11(a) shows a sintered compact 101 obtained by sintering a compact. The sintered compact 101 includes a main portion 103A and a plurality of embossed portions 105 formed on an upper surface of a main portion 103A in parallel relation in a direction perpendicular to the sheet surface of the drawing. Although the embossed portions 105 are smaller in height than the fins of a sheet member to be manufactured, they have a sufficiently large area in section. The dimension of the area of the embossed portions 105 is appropriately established based on pressure applicable at the time of repressing, density of the sintered compact 101, etc. Then, the sintered compact 101 is repressed by a repressing die. A coining form corresponding to a desired configuration of the fins is formed on a punching surface of an upper punch of the repressing die. FIG. 11(b) shows a sheet member 102 having fins, obtained by repressing. This sheet member 102 has a plurality of fins 104 formed on an upper surface of a main portion 103 by the coining form. Those fins 104 each have an acute shape in section. They are formed when the embossed portions 105 of the sintered compact 101 are reduced in thickness by being compressed and plastic flowed at the time of repressing.

Since the fins 104 of the sheet member 102 thus obtained according to Embodiment 3 are formed when the embossed portions 105 of the sintered compact 101 are plastic flowed during the repressing operation and such plastic flow readily occurs, the fins 104 can easily be formed. Since the embossed portions 105 are larger in thickness and smaller in height than the fins 104, they are less damaged and less collapsed when compared with a case where the embossed portions are about the same in dimension as the fins 104. As a consequence, the compact is easy to handle and workability is enhanced.

Figure 12:
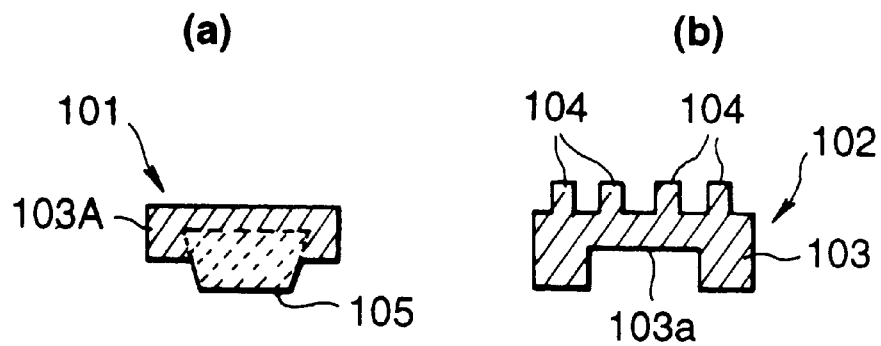
FIGS. 12(a) and 12(b) are views showing manufacturing processes of a sheet member of Embodiment 4 according to the second embodiment of the present invention.

(4) Embodiment 4—FIG. 12

Embodiment 4 based on the first embodiment of the present invention will now be described.

FIG. 12(a) shows a sintered compact 101 obtained by sintering a compact. The sintered compact 101 includes a main portion 103A and an embossed portion 105 of an appropriate thickness, formed on a central area of a lower surface of the main portion 103A. The thickness of the embossed portion 105 is appropriately established based on pressure applicable at the time of repressing, density of the sintered compact 101, etc. Then, the sintered compact 101 is repressed by a repressing die. A coining form corresponding to a desired configuration of the fins is formed on a working surface of an upper punch of the repressing die. FIG. 12(b) shows a sheet member 102 having fins, obtained by repressing. This sheet member 102 has a plurality of fins 104 formed on an upper surface of the main portion 103 which has a recess 103a for mounting an IC, formed in a lower surface thereof. Those fins 104 are formed in parallel relation in a direction perpendicular to the sheet surface of the drawing. Those fins 104 are formed when a thick part corresponding to a combined-thickness portion (the portion indicated by broken lines of FIG. 12(a)) of the embossed portion 105 of the sintered compact 101 and a part of the remaining portion is plastic flowed in such a manner as to be pushed up.

According to Embodiment 4, since the fins 104 of the sheet member 102 thus obtained are formed when the embossed portion 105 of the sintered compact 101 and a part of the remaining portion are pressed and plastic flowed, an equal density of the fins 104 to that of the main portion 103 is ensured and heat dissipating effect is enhanced. Since no fins 104 are formed on the sintered compact 101 and merely the embossed portion 105 on which the fins 106 are to be formed are formed thereon, the compact is easy to handle and workability is enhanced.

Figure 13:
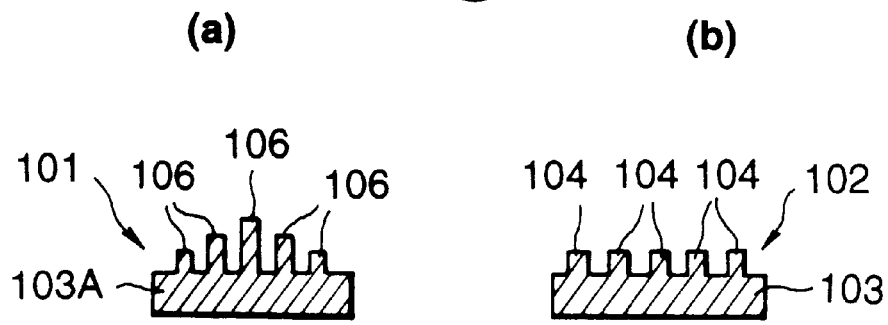
FIGS. 13(a) and 13(b) are views showing manufacturing processes of a sheet member of Embodiment 5 according to the second embodiment of the present invention.

(5) Embodiment 5—FIG. 13

Embodiment 5 based on the first embodiment of the present invention will now be described.

FIG. 13(a) shows a sintered compact 101 obtained by sintering a compact. The sintered compact 101 includes a main portion 103A and a plurality of ridges (embossed portions) 106 formed on an upper surface of the main portion 103A. Those ridges 106 are formed in parallel relation in a direction perpendicular to the sheet surface of the drawing and gradually increased in height towards the center in the left and right directions, thus exhibiting a chevron shape as a whole. Any of those ridges 106 is set higher than a desired height of the fins of the sheet member to be manufactured. Then, the sintered compact 101 is repressed by a repressing die. A coining form adapted to form desired fins is formed on a working surface of an upper punch of the repressing die. FIG. 13(b) shows a sheet member 102 having fins, obtained by repressing. This sheet member 102 has a plurality of fins 104 formed on an upper surface of a main portion 103 by the coining form. Those fins 104 are formed when the ridges 106 of the sintered compact 101 are reduced in thickness by being compressed in a direction that the height thereof are reduced, and plastic flowed at the time of repressing.

According to Embodiment 5, since the ridges 106 are increased in height towards the center, the working degree of the fins 104 at the central area becomes particularly high. In the case that a plurality of fins arranged in parallel relation are formed by the powder metallurgical method, green density at an area nearer the center is low and coarse than at the area around the central area. However, by preliminarily forming the height of those ridges 106 at the central area high, the working degree at the central portion is increased to obtain a sufficient density, so that the entire density can be uniformed as much as possible. Therefore, the sheet member 2 having fins thus obtained exhibits a sufficient heat dissipating effect.

Figure 14:
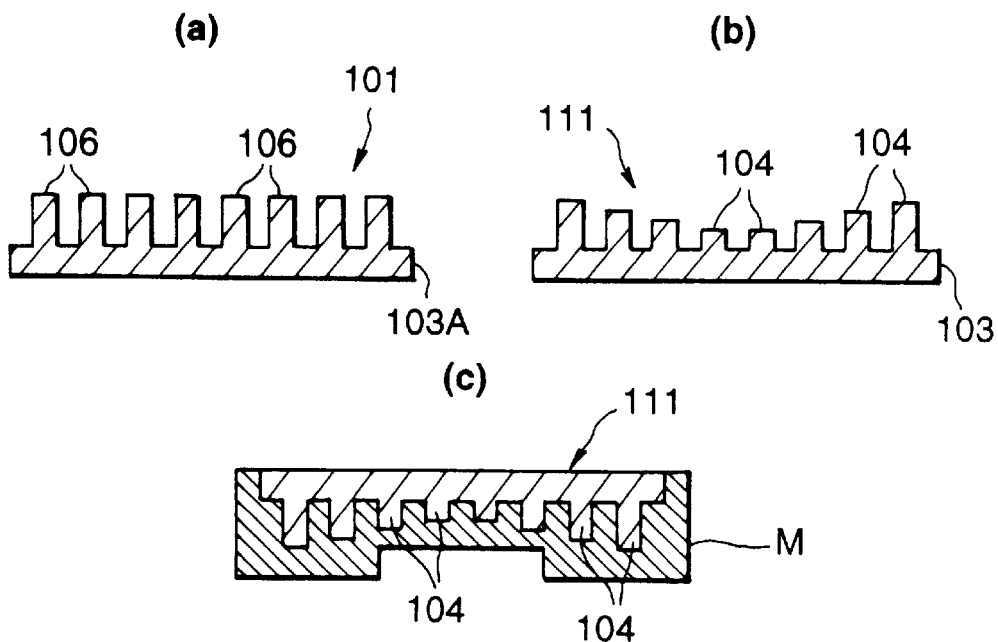
FIGS. 14(a) to 14(c) are views showing manufacturing processes of a heat spreader of Embodiment 6 according to the second embodiment of the present invention.

(6) Embodiment 6—FIG. 14

Embodiment 6 based on the first embodiment of the present invention will now be described. Embodiment 6 is a manufacturing example of a heat spreader molded with resin to constitute an IC package.

FIG. 14(a) shows a sintered compact 101 obtained by sintering a compact. The sintered compact 101 includes a main portion 103A and a plurality of ridges (embossed portions) 106 of a uniform height, formed on an upper surface of the main portion 103A. Those ridges 106 are arranged in parallel relation in a direction perpendicular to the sheet surface of the drawing. Here in this embodiment, those ridges 106, among all the ridges 106 of the sintered compact 101, located rather on the end portions have desired density but the density becomes coarser towards the central portion due to characteristics at the time of forming of a compact. Then, the sintered compact 101 is repressed by a repressing die. Here in this embodiment, a coining form for forming fins serving to reduce the height of the ridges 106 towards the central portion is formed on a punching surface of an upper punch of the repressing die. FIG. 14(b) shows a heat spreader (sheet member) 111 thus obtained. This heat spreader 111 has a plurality of fins 104 formed on an upper surface of a main portion 103 by the coining form. Those fins 104 are formed when the ridges 106 are reduced in thickness towards the central portion from the end portions by being repressed and those fins 104 which are gradually reduced in height, are formed when the ridges 106 are plastic flowed by being compressed. FIG. 14(c) shows a state where the heat spreader 111 thus obtained is molded with resin. In this case, that side of the heat spreader 111 formed with the fins 104 is molded with resin M and the other side, namely, the flat surface of the heat spreader 111 is flush with the surface of the resin M.

According to Embodiment 6, since the working degree of the fins 104 located at the central portion becomes particularly high, the density of those fins 104 located at the central portion is equally supplemented as those fins 104 located at the end portions. Therefore, the density of the entire fins 104 can be uniformed as much as possible. Thus, the obtained heat spreader 111 exhibits a sufficient heat absorbing effect, i.e., heat dissipating effect. It should be noted that the heat spreader 111 is molded with the resin M on the side where the fins 104 are formed but it can also be used as a heat sink which is placed on an IC package with its side, where the fins 104 are formed, facing up.

Figure 15:
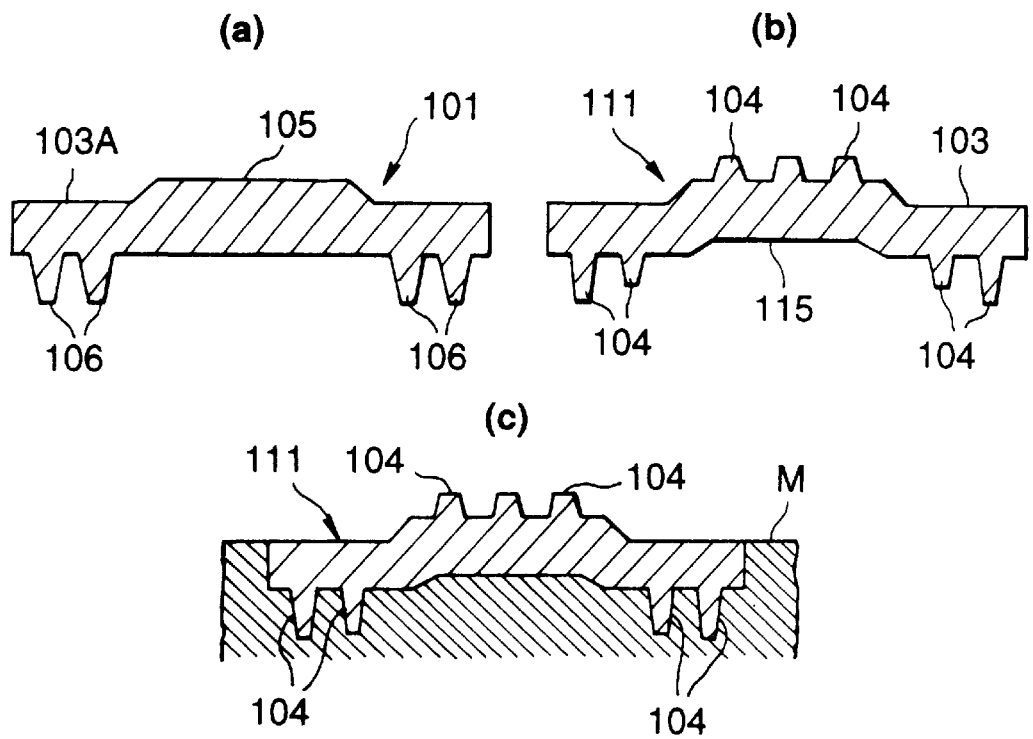
FIGS. 15(a) to 15(c) are views showing manufacturing processes of a heat spreader of Embodiment 7 according to the second embodiment of the present invention.

(7) Embodiment 7—FIG. 15

Embodiment 7 based on the first embodiment of the present invention will now be described. Embodiment 7 is also a manufacturing example of a heat spreader molded with resin to constitute an IC package as in Embodiment 6.

FIG. 15(a) shows a sintered compact 101 obtained by sintering a compact. The sintered compact 101 includes a main portion 103A, a platform-like embossed portion 105 having an appropriate and generally constant thickness, formed on a central portion of an upper surface of the main portion 103A, and a plurality of ridges (embossed portions) 106 having a uniform height, formed on a peripheral edge of a lower surface of the main portion 103A. The ridges 106 are arranged in parallel relation in a direction orthogonal to the sheet surface of the drawing. Then, the sintered compact 101 is repressed by a repressing die. A coining form corresponding to a desired configuration of the fins is formed on a working surface of an upper punch of the repressing die. Also, a coining form corresponding to a recess formed in a central portion and the configuration of fins formed on the lower surface is formed on a working surface of a lower punch of the repressing die. FIG. 15(b) shows a heat spreader 111 thus obtained. This heat spreader 111 has a plurality of fins 104 formed on an upper surface of a main portion 103 by the coining form. The heat spreader 111 is formed in a central portion of a lower surface thereof with a recess 115 and on end portions thereof with the fins 104. Those fins 104 on the upper surface of the heat spreader 111 are formed when the embossed portions 105 of the sintered compact 101 are compressed and plastic flowed at the time of repressing. Also, the fins 104 on the lower surface are formed by compressing the ridges 106 and those fins 104 located on an inner side are also compressed in height. They are formed by plastic flow of the ridges 106 subjected to compressing treatment. FIG. 15(c) shows a state where the heat spreader 111 thus obtained is molded with resin M. In this case, that side of the heat spreader 111 formed with the fins 104 is molded with resin M and the other side, namely, the upper surface of the peripheral edge of the main portion 103 is flush with the surface of the resin M.

According to Embodiment 7, those fins 104 on the lower surface embedded in the resin M are high in working degree because the ridges 106 are compressed and those fins 104 formed on the inner side, which readily become coarse in density, are reduced in height, whereby the density is uniformed. Further, since the fins 104 are also formed on the upper surface, the obtained heat spreader 111 can effectively absorb the heat generated from an IC through the fins 104 formed on the lower surface and effectively dissipate the heat through the fins 104 formed on the upper surface.

It should be noted here that the first embodiment hereinbefore described with reference to Embodiments 1 to 7 is merely one form embodying the present invention and that the present invention is by no means limited to the above embodiments but it is likewise applicable to any other forms inasmuch as fins are formed by repressing a sintered compact.

Third Embodiment

The third embodiment of the present invention will now be described.

The third embodiment relates to a method of manufacturing a heat spreader by sintering, which spreader is provided with a means for preventing its escape from resin with which it is molded when built in as an IC package. Embodiments 1 to 6 based on the third embodiment will be described hereinafter.

Figure 16:
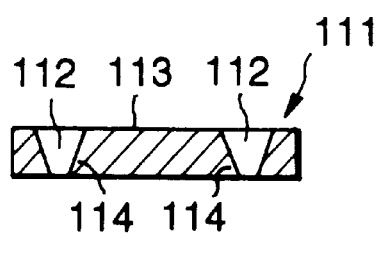
FIGS. 16(a) and 16(b) are views showing a heat spreader of Embodiment 1 according to the third embodiment of the present invention.
Figure 16:
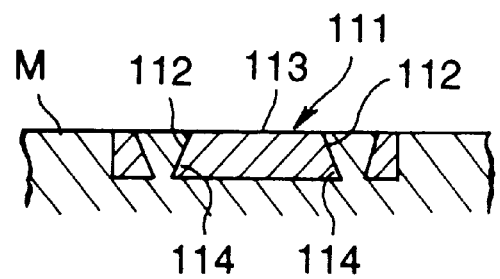

(1) Embodiment 1—FIG. 16

FIG. 16(a) shows a heat spreader 111 of Embodiment 1. This heat spreader 111 is obtained by repressing a sintered compact, which is obtained by sintering a compact, which is obtained by compressing material powder. The heat spreader 111 is formed in a sheet-like configuration. The heat spreader 111 is formed in appropriate places thereof with a plurality of escape-preventive holes 112 extending all the way therethrough in its thickness direction. Those escape-preventive holes 112 are formed when the compact is formed. Each of the escape-preventive holes 112 is circular in section and tapered such that it is dilated towards an upper surface 113 (FIG. 16(a)). By forming those escape-preventive holes 112, an engaging wall portion 114 is formed around each escape-preventive hole 112.

FIG. 16(b) shows a state where the heat spreader 111 is molded with resin as an IC package. The heat spreader 111 is exposed only at its upper surface 113 and resin M is filled in each escape-preventive hole 112. In that state, since the engaging wall portions 114 are in contact with the resin M filled in each escape-preventive hole 112, the heat spreader 111 is prevented from moving towards its upper surface side. Thus, the escape of the heat spreader 111 from the resin M is positively prevented.

Figure 17:
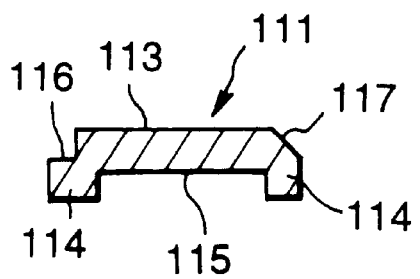
FIGS. 17(a) and 17(b) are views showing a heat spreader of Embodiment 2 according to the third embodiment of the present invention.
Figure 17:
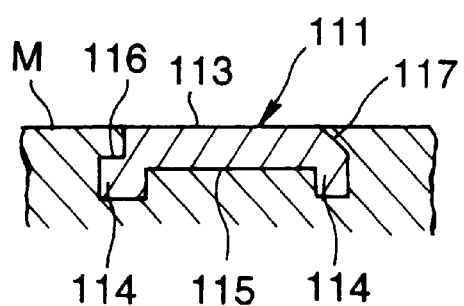

(2) Embodiment 2—FIG. 17

FIG. 17 shows a heat spreader 111 of Embodiment 2. This heat spreader 111 has a recess 115 formed in a central area of its lower surface and adapted to receive an IC therein. It also has a step portion 116 formed on one end portion of its upper surface 113 and a slanted surface 117 formed on the other end portion. The step portion 116 and the slanted surface 117 are formed by coining when a sintered compact is repressed. By forming the step portion 116, an engaging wall portion 114 having a rectangular configuration in section is formed on a lower side of the step portion 116. On the other hand, by forming the slanted surface 117, an engaging wall portion 114 having a trapezoidal configuration is formed on a lower side of the slanted surface 117.

FIG. 17(b) shows a state where the heat spreader 111 is molded with resin M as an IC package. The heat spreader 111 is exposed only at its upper surface 113 and resin M is filled in those areas above the step portion 116 and the slanted surface 117 such that the resin M is flush with the upper surface 113 of the heat spreader 111. In that state, since the engaging wall portions 114, 114 are in contact with the resin M occupying those areas above the step portion 116 and the slanted surface 113, the heat spreader 111 is prevented from moving towards its upper surface side. Thus, the escape of the heat spreader 111 from the resin M is positively prevented.

Figure 18:
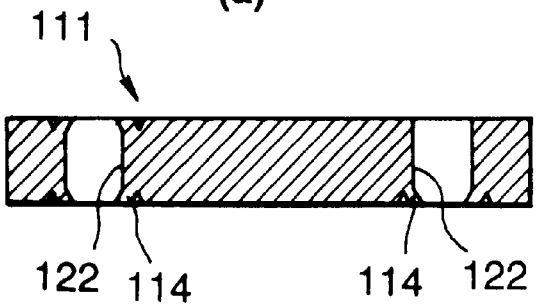
FIGS. 18(a) to 18(c) are views showing a heat spreader of Embodiment 3 according to the third embodiment of the present invention.
Figure 18:
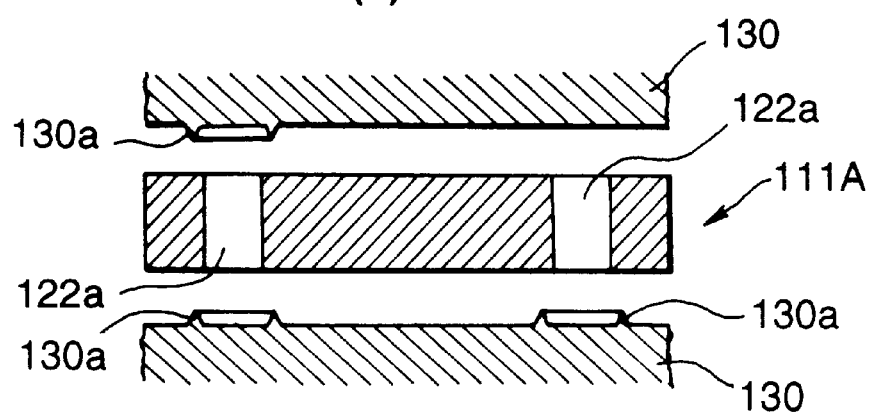
Figure 18:
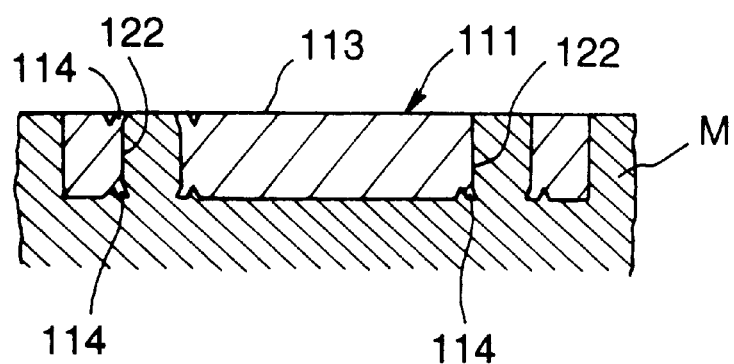

(3) Embodiment 3—FIG. 18

FIG. 18(a) shows a heat spreader 111 of Embodiment 3. The heat spreader 111 is formed with a plurality of escape-preventive holes 122 extending all the way therethrough in its thickness direction. The escape-preventive hole 122 on the left-hand side of FIG. 18(a) is circular in section and exhibits a barrel shape in which the diameter is gradually enlarged towards its axially central portion from an upper and a lower opening thereof. The wall portions at peripheral edges of the upper and lower openings serve as engaging wall portions 114 protruding inwardly of the escape-preventive holes 122. For preventing escape of the heat spreader 111, it is also accepted that the engaging wall portions 114 are formed only on the lower surface as in the escape-preventive hole 122 on the right-hand side of FIG. 18(a). In order to form such escape-preventive holes 122, as shown in FIG. 18(b), round holes 122a having a uniform diameter corresponding to the escape-preventive holes 122 are formed when the compact 111A is formed and then, the wall portion at the peripheral edge of the opening of each round hole 122a is compressed and plastically deformed by upper and lower punches 130 each having a ring-like protrusion 130a when the sintered compact is repressed. The wall portions, thus formed by repressing, at the peripheral edges of the openings of the upper and lower surfaces, serve as the engaging wall portions 114 protruding inwardly of the escape-preventive holes 122.

FIG. 18(c) shows a state where the heat spreader 111 is molded with resin M as an IC package. The heat spreader 111 is exposed only at its upper surface 113 and resin M is filled in escape-preventive holes 122. In that state, since the engaging wall portions 114, 114 are in contact with the resin M, the heat spreader 111 is prevented from moving towards its upper surface side. Thus, the escape of the heat spreader 111 is positively prevented.

Figure 19:
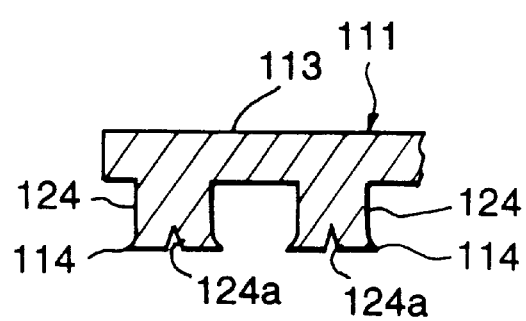
FIGS. 19(a) to 19(d) are views showing a heat spreader of Embodiment 4 according to the third embodiment of the present invention.
Figure 19:
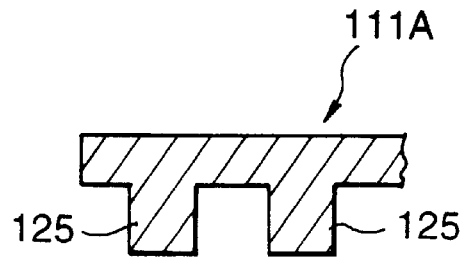
Figure 19:
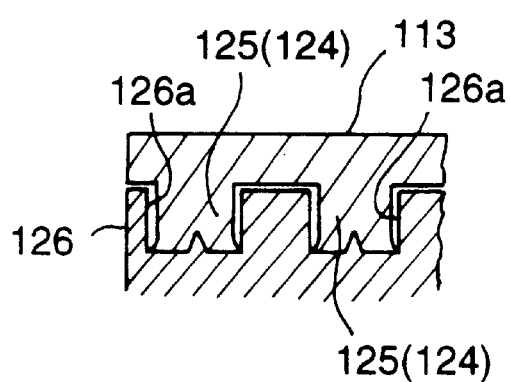
Figure 19:
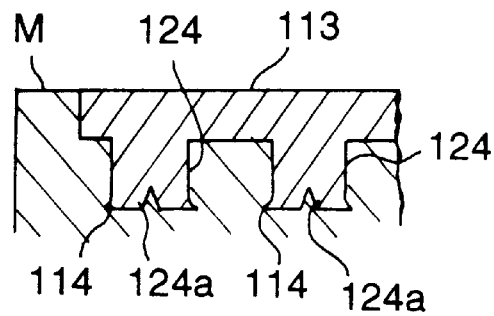

(4) Embodiment 4—FIG. 19

FIG. 19(a) shows a heat spreader 111 of Embodiment 4. This heat spreader 111 has a plurality of protrusions 124 projecting downwardly from a lower surface thereof. An acute recess 124a is formed in a central area of a lower end face of each protrusion 124. On a peripheral edge of each protrusion 124, there is formed with a engaging wall portion 114 projecting in a direction of a plane of the heat spreader 111 and spreading in the fashion of a skirt. In order to manufacture such a heat spreader 111, first, as shown in FIG. 19(b), a sintered compact 111A having protrusions 125 corresponding to the protrusions 124 is obtained by sintering and then, as shown in FIG. 19(c), the sintered compact 111A is repressed. At the time of repressing, the protrusions 125 are inserted into corresponding female forms 126a having a larger width than the protrusions 125, of a lower punch 126, and the recesses 124a and the engaging wall portions 114 are formed by coining with use of the lower punch 126.

FIG. 19(d) shows a state where the heat spreader 111 is molded with resin M as an IC package. The heat spreader 111 is exposed only at its upper surface 113 in such a manner as to be flush with the resin M. In that state, since the engaging wall portions 114, 114 are in contact with the resin M, the heat spreader 111 is prevented from moving towards its upper surface side. Thus, the escape of the heat spreader 111 is positively prevented.

Figure 20:
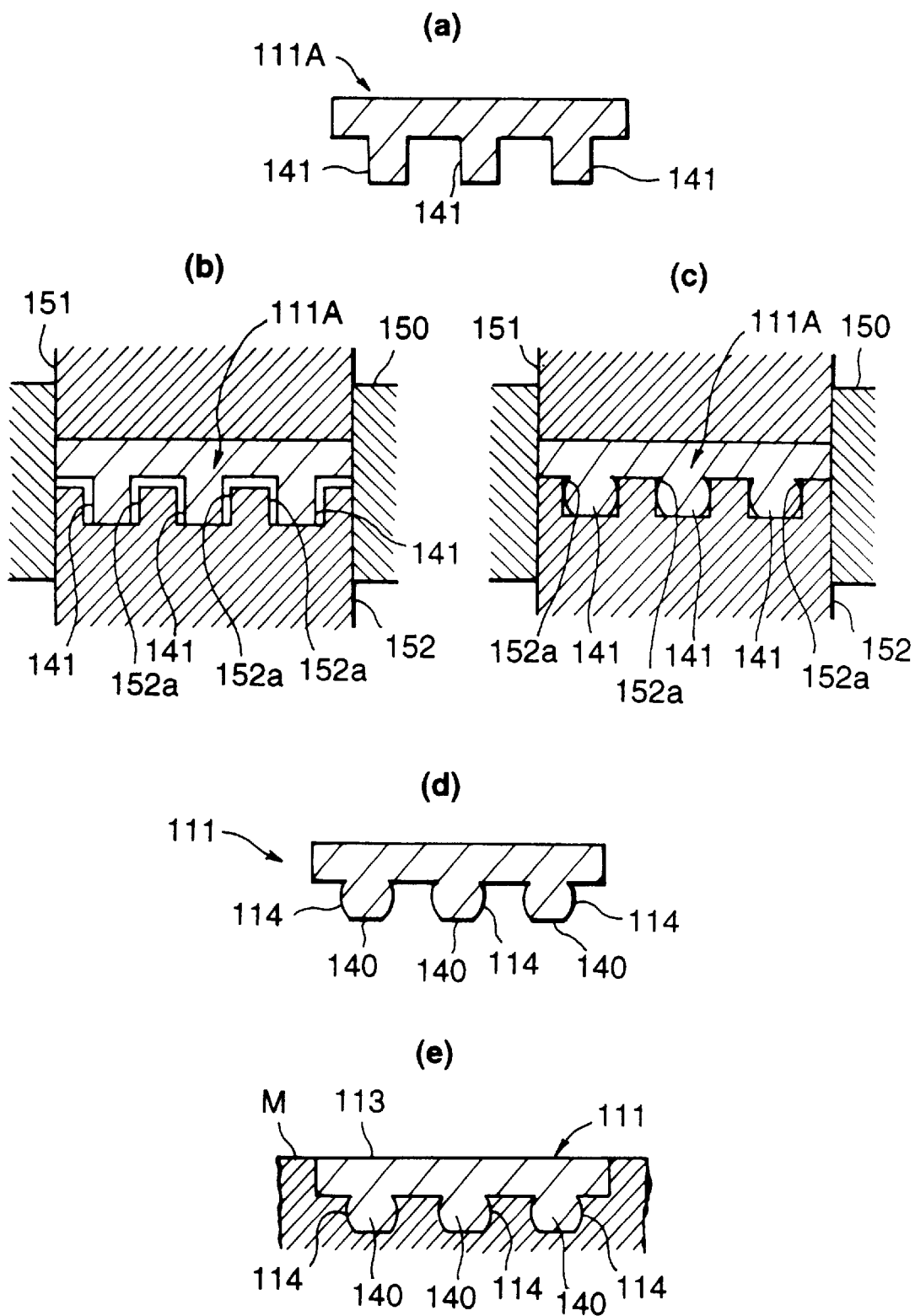
FIGS. 20(a) to 20(e) are views showing a heat spreader of Embodiment 5 according to the third embodiment of the present invention.

(5) Embodiment 5—FIG. 20

FIG. 20(d) shows a heat spreader 111 of Embodiment 5. The heat spreader 111 has a plurality of protrusions 140 projecting downwardly from its lower surface. Those protrusions 140 are circular in section and each protrusion 140 exhibits a barrel shape in which the diameter is gradually enlarged towards its axially central portion from an upper and a lower opening thereof. The enlarged body portion of the barrel serves as engaging wall portion 114. In order to manufacture such a heat spreader 111, first, as shown in FIG. 20(a), a sintered compact 111A having protrusions 141 corresponding to the protrusions 140 is obtained by sintering and then, as shown in FIG. 20(b), the sintered compact 111A is set in a repressing die. This repressing die comprises a die 150, and an upper and a lower punches 151, 152 disposed within the die 150. The lower punch 152 is formed with female forms 152a having a larger diameter than the protrusions 141 and having an axially short length. The protrusions 141 are inserted into corresponding female forms 152a, and the sintered compact 111A is compressed by the upper and lower punches 151, 152. As shown in FIG. 20(c), when the sintered compact 111A is repressed, the protrusions 141 are collapsed, by plastic blow, to provide a barrel-like configuration.

As shown in FIG. 20(e), the heat spreader 111 thus obtained is molded at its side where the protrusions 140 are formed, with resin M as an IC package. Also in this case, only the upper surface 113 is exposed in such a manner as to be flush with the resin. In that state, since the engaging wall portions 114 are in contact with the resin M, the heat spreader 111 is prevented from moving towards its upper surface side. Thus, the escape of the heat spreader is positively prevented.

Figure 21:
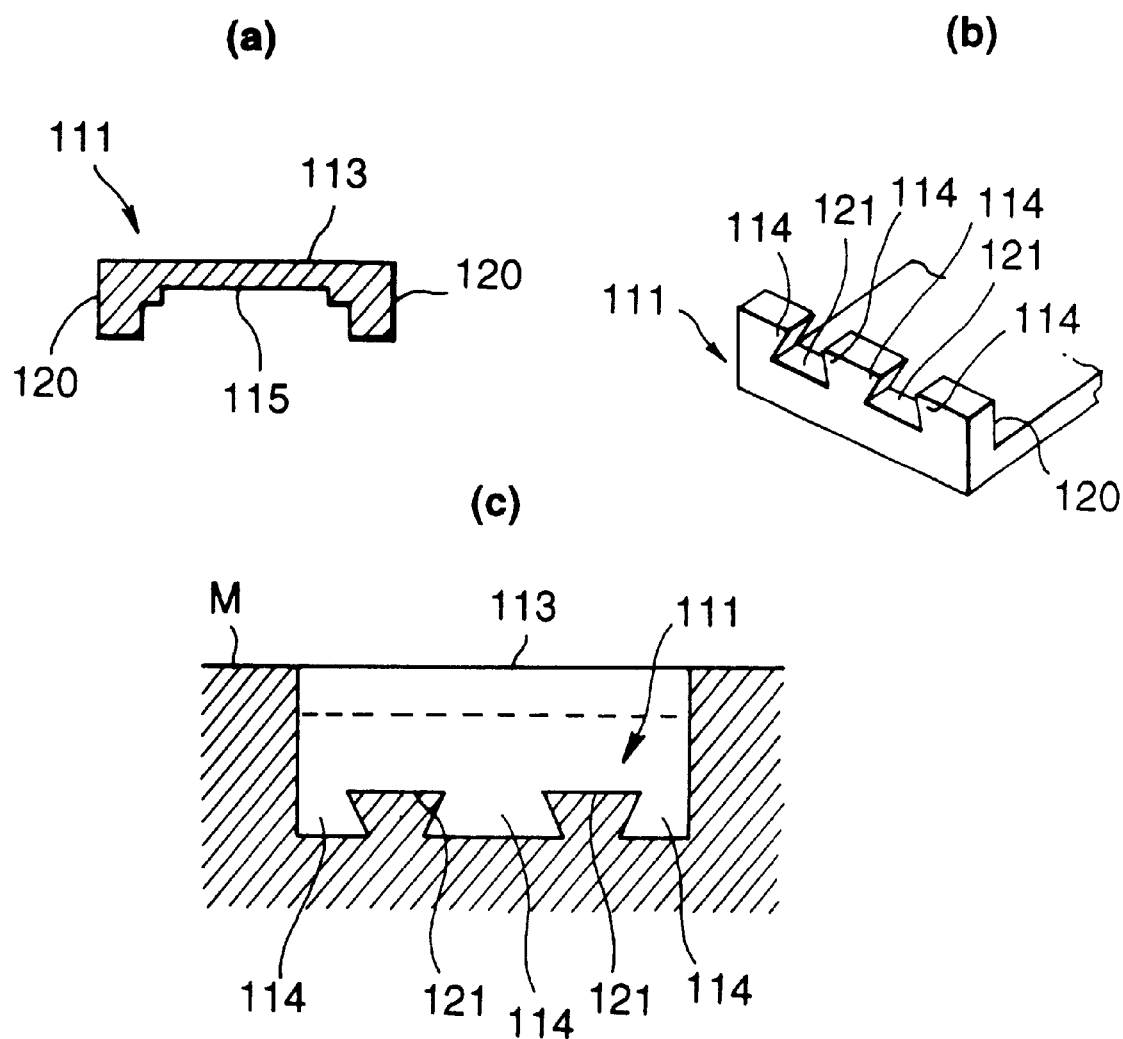
FIGS. 21(a) to 21(c) are views showing a heat spreader of Embodiment 6 according to the third embodiment of the present invention.

(6) Embodiment 6—FIG. 21

FIG. 21(a) shows a heat spreader 111 of Embodiment 6. This heat spreader 111 has a recess 115 formed in a central area of its lower surface and adapted to receive an IC therein. It also has edge portions 120 projecting downwardly from paired opposite end portions of its lower surface. As shown in FIG. 21(b), a plurality of notches 121 opening to the lower surface of the heat spreader 111 are formed in the edge portions 120. Each notch 121 exhibits a trapezoidal configuration which is gradually reduced in width towards the opening from the upper surface 113. By this, on opposite sides of each notch 121, there are formed triangular engaging wall portions 114. The engaging wall portions 114 are formed by coining when a sintered compact is repressed. For this purpose, for example, simple rectangular notches corresponding to the notches 121 are formed when the compact is formed, and the thick portion at an end portion of an opening of each notch is compressed from the opening side so as to be plastically flowed at the time of the repressing operation.

FIG. 21(c) shows a state where the heat spreader 111 is molded with resin M as an IC package. The heat spreader 111 is exposed only at its upper surface 113 and resin M is filled in the notches 121. In that state, since the engaging wall portions 114 are in contact with the resin M filled in the notches 121, the heat spreader 111 is prevented from moving towards its upper surface side. Thus, the escape of the heat spreader 111 from the resin M is positively prevented.

It should be noted here that the third embodiment hereinbefore described with reference to Embodiments 1 to 6 is merely one form embodying the present invention and that the present invention is by no means limited to the above embodiments but it is likewise applicable to any other forms inasmuch as those forms are provided with engaging wall portions capable of positively preventing escape of the heat spreader from resin.

Furthermore, the present invention can also be applied to other sheet members than such heat dissipating plates as the heat spreaders and heat sinks for an IC package when such sheet members are manufactured. The present invention is especially suitable as a method of manufacturing a product for which a high accuracy of flatness is required and for which deformation is required to be prevented.

INDUSTRIAL APPLICABILITY

The present invention can be applied as a method of manufacturing a heat dissipating plate such as a heat spreader, a heat sink, or the like which is to be built in an IC package in such a manner as to be molded with resin, and a heat dissipating plate.

What is claimed is:

1. A method of manufacturing a sheet member comprising: obtaining a sintered compact by sintering a sheet-like compact having a reduced-thickness portion and an enlarged-thickness portion; and then repressing said sintered compact into a sheet member, wherein a difference in density between said reduced-thickness portion and said enlarged-thickness portion of said sintered compact after said repressing is in a range of ±1.5%.

2. A method of manufacturing a sheet member according to claim 1, wherein a true density ratio of said sintered compact after said repressing is in a range of from 95 to 99%.

3. A method of manufacturing a sheet member according to claim 1, wherein a rib is formed on at least one surface of said compact and said rib remains even after said repressing.

4. A method of manufacturing a sheet member according to claim 1, wherein said sheet member to be manufactured is of a generally rectangular shape, and an inwardly curved recess is formed on a side portion of said compact when said compact is being formed.

5. A method of manufacturing a sheet member according to claim 1, wherein a hole is formed in said sintered compact in such a manner as to extend all the way through a thickness of said sintered compact while said repressing is undergoing.

6. A method of manufacturing a sheet member according to claim 5, wherein a recess is preliminarily formed in an area of said sintered compact where said hole is formed.

7. A method of manufacturing a sheet member comprising: producing a compact having a sheet-like main portion and an embossed portion protruding from said main portion; obtaining a sintered compact by sintering said compact and then repressing the same; and compressing said embossed portion while said repressing is undergoing, thereby forming a fin.

8. A method of manufacturing a sheet member according to claim 7, wherein said embossed portion is in the form of a platform.

9. A method of manufacturing a sheet member according to claim 7, wherein said embossed portion is a ridge or a protrusion having a larger dimension than a desired dimension of said fin generally in proportion to the shape of said fin after manufacturing.

10. A method of manufacturing a sheet member according to claim 7, wherein said embossed portion is formed on an opposite side to the area where said fin is formed after manufacturing.

11. A method of manufacturing a sheet member according to claim 7, wherein a plurality of said embossed portions are arranged in array from one end of said sintered compact to the other end such that said embossed portions are gradually increased in height towards the center in a direction of said array.

12. A method of manufacturing a sheet member according to claim 7, wherein a plurality of said embossed portions are arranged in array from one end of said sintered compact to the other end such that said embossed portions are gradually reduced in height towards the center in a direction of said array.

13. A method of manufacturing a sheet member according to claim 7, wherein a plurality of tiny bumps and valleys are formed on at least one punching surface forming a surface of said sheet member while said repressing is undergoing.

14. A method of manufacturing a sheet member, said sheet member being molded with resin such that one surface of said sheet member is exposed, said method comprising: obtaining a sintered compact by sintering a compact; then repressing said sintered compact; and forming an engaging wall portion on said sheet member while said repressing is undergoing so that said sheet member will not escape from said resin.

15. A method of manufacturing a sheet member according to claim 14, wherein said engaging wall portion is gradually increases in sectional area in an opposite direction to an escaping direction of said sheet member from said resin.

16. A sheet member obtained by repressing a sintered compact and having a reduced-thickness portion and an enlarged-thickness portion, wherein a difference in density between said reduced-thickness portion and said enlarged-thickness portion of said sintered compact after said repressing is in a range of ±1.5%.

17. A sheet member according to claim 16, wherein a true density ratio of said sintered compact after said repressing is in a range of from 95 to 99%.

18. A heat dissipating plate formed from a sheet member of claim 16.

19. A heat dissipating plate formed from a sheet member of claim 17.

* * * * *

UNITED STATES PATENT AND TRADEMARK OFFICE
CERTIFICATE OF CORRECTION

PATENT NO.   : 6,139,975
DATED        : October 31, 2000
INVENTOR(S)  : Osamu Mawatari et al.

Page 1 of 1

It is certified that error appears in the above-identified patent and that said Letters Patent is hereby corrected as shown below:

<u>Title page,</u>
Item [73], "Powered" should read -- Powdered --

Signed and Sealed this

Fifteenth Day of April, 2003

JAMES E. ROGAN
*Director of the United States Patent and Trademark Office*